(12) United States Patent
Hatakeyama et al.

(10) Patent No.: US 8,368,018 B2
(45) Date of Patent: Feb. 5, 2013

(54) METHOD AND APPARATUS FOR CHARGED PARTICLE BEAM INSPECTION

(75) Inventors: Masahiro Hatakeyama, Tokyo (JP); Takumi Ota, Kanagawa (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/506,475

(22) Filed: Jul. 21, 2009

(65) Prior Publication Data

US 2010/0019147 A1 Jan. 28, 2010

(30) Foreign Application Priority Data

Jul. 22, 2008 (JP) ................................. 2008-188214

(51) Int. Cl.
*G01N 23/00* (2006.01)
(52) U.S. Cl. ........................ 250/310; 250/306
(58) Field of Classification Search .................. 250/306, 250/307, 310

See application file for complete search history.

(56) References Cited

U.S. PATENT DOCUMENTS

| | | | | |
|---|---|---|---|---|
| H589 H | * | 2/1989 | Sartore | 250/307 |
| 6,610,980 B2 | * | 8/2003 | Veneklasen et al. | 850/8 |
| 6,667,478 B2 | * | 12/2003 | Frosien et al. | 250/310 |
| 2002/0190207 A1 | * | 12/2002 | Levy et al. | 250/306 |
| 2003/0132382 A1 | * | 7/2003 | Sogard | 250/311 |
| 2005/0199808 A1 | | 9/2005 | Obara et al. | |
| 2007/0026541 A1 | * | 2/2007 | Kokura | 438/7 |
| 2007/0031026 A1 | | 2/2007 | Kurihara et al. | |
| 2007/0085005 A1 | | 4/2007 | Hasegawa et al. | |
| 2007/0085006 A1 | * | 4/2007 | Motoki | 250/310 |
| 2007/0194229 A1 | * | 8/2007 | Okuda et al. | 250/310 |
| 2008/0173815 A1 | * | 7/2008 | Nakasuji et al. | 250/310 |
| 2008/0296496 A1 | * | 12/2008 | Zhao et al. | 250/307 |

FOREIGN PATENT DOCUMENTS

| | | |
|---|---|---|
| JP | 2001-319612 A | 11/2001 |
| JP | 2005-5477 A | 1/2005 |
| JP | 2005-158642 A | 6/2005 |
| JP | 2005-259396 A | 9/2005 |
| JP | 2006-227026 A | 8/2006 |
| JP | 2006-343346 A | 12/2006 |
| JP | 2006-351303 A | 12/2006 |
| JP | 2007-040910 A | 2/2007 |

OTHER PUBLICATIONS

Japanese Office Action dated Nov. 13, 2012, issued in corresponding Japanese Patent Application No. 2008-188214 (3 pages), with English Translation of Office Action.

\* cited by examiner

*Primary Examiner* — Robert Kim
*Assistant Examiner* — Jason McCormack
(74) *Attorney, Agent, or Firm* — Westerman, Hattori, Daniels & Adrian, LLP (57) ABSTRACT

A charged particle beam inspection apparatus comprises: an electron gun for irradiating an electron beam onto a sample; a detector for detecting a signal obtained from the sample; an image processor for forming an image from the signal obtained from the detector, and an energy controller for controlling the beam energy of the electron beam to be irradiated onto the sample. An identical charged particle beam inspection apparatus carries out a plurality of types of inspections. An inspection apparatus of a projection type may be applied thereto. A pattern defect inspection, a foreign material inspection, and an inspection for a defect in a multilayer are carried out. Beam energies E1, E2, and E3 in those inspections have a relation $E1>E2$ and $E3>E2$. Charge removal is performed in a transport chamber or other vacuum chamber before an inspection.

21 Claims, 9 Drawing Sheets

INSPECTION FLOW A

Fig. 2B

INSPECTION FLOW B

INSPECTION FLOW C

Fig. 6B

INSPECTION FLOW D

METHOD AND APPARATUS FOR CHARGED PARTICLE BEAM INSPECTION

CROSS REFERENCE TO RELATED APPLICATION

This application claims the benefit of Japanese Patent Application No. 2008-188214 filed on Jul. 22, 2008 in Japan, the subject matter of which is hereby incorporated by reference.

BACKGROUND OF THE INVENTION

1. Field of the Invention

The present invention relates to a method and apparatus that uses an electron beam or other charged particle beams to inspect an object to be inspected.

2. Description of the Related Arts

Conventionally, in semiconductor manufacturing techniques, an optical inspection apparatus is used to inspect a mask, a wafer, or the like. The types of those inspections include a pattern defect inspection and a foreign material inspection, and the foreign material is, for example, a particle. An optical inspection apparatus irradiates laser or other light onto a sample, and detects light scattered by particles.

An optical inspection apparatus can inspect with a relatively high S/N and relatively high rate. However, the resolution is relatively low, and the detection sensitivity significantly decreases when the size of a defect is 50 nm or less, resulting in difficulty in detection.

For a pattern defect inspection, an inspection apparatus of a scanning electron microscope (SEM) type is used in order to inspect for fine pattern defects that cannot be inspected by an optical inspection apparatus. An SEM type inspection apparatus is configured to scan a sample with an electron beam as a charged particle beam, and can inspect even if the size of a pattern defect is 50 nm or less or, particularly, 20 nm or less. An SEM type inspection apparatus is disclosed, for example, in Japanese Patent Laid-Open Application No. 2007-40910.

As described above, an SEM type inspection apparatus is suitable for inspection for fine defects, and can detect a pattern defect of 50 nm or less. However, an SEM type inspection apparatus is not generally applied to a particle inspection. Applying an SEM type inspection apparatus to a particle inspection would require the pixel size of the SEM to be ½ to ⅓ of a particle or less in order to determine a particle, and would therefore take a significantly long time.

Moreover, no method for efficiently carrying out an inspection for a defect in a multilayer has yet been established in conventional inspection techniques. An inspection for a defect in a multilayer refers to an inspection for a foreign material buried in layers, or the like. An optical inspection apparatus and an SEM inspection apparatus can only detect defects on the surface of a sample and cannot detect defects in layers.

As above, conventional SEM-type inspection apparatuses can only be applied to a pattern defect inspection, but one inspection apparatus cannot carry out inspections for a plurality of types of defects. Specifically, one inspection apparatus would not be able to carry out a plurality of types of inspections including a pattern defect inspection, a foreign material inspection, and an inspection for a defect in a multilayer. This is because the plurality of types of inspections requires different detection methods and mechanisms, and therefore the inspection apparatuses could hardly be merged. Such a state is inconvenient to users, causes the inspection efficiency to decrease, and increases space required for the inspection apparatuses.

SUMMARY OF THE INVENTION

A purpose of the invention made in the above-mentioned background is to provide a method and apparatus for a charged particle beam inspection with which one inspection apparatus can carry out a plurality of types of inspections.

An aspect of the invention is an inspection method using a charged particle beam, and the method comprises: irradiating a charged particle beam onto an object to be inspected; detecting a signal obtained from the object to be inspected; and forming an image from the detected signal. In the invention, an identical charged particle beam inspection apparatus carries out a plurality of types of inspections. The plurality of types of inspections may include a first, a second, and a third inspection. The first, second, and third inspections may be a pattern defect inspection, a foreign material inspection, and an inspection for a defect in a multilayer, respectively, and in the first, second, and third inspections, charged particle beams having beam energies $E1$, $E2$, and $E3$ different from one another may be irradiated, respectively.

Another aspect of the invention is a charged particle beam inspection apparatus, and the apparatus comprises: a stage for supporting an object to be inspected; a charged particle beam source for irradiating a charged particle beam onto the object to be inspected; a detector for detecting a signal obtained from the object to be inspected; an image processor for forming an image from the signal obtained from the detector; and an energy controller for controlling the beam energy of the charged particle beam to be irradiated onto the object to be inspected, where an identical charged particle beam inspection apparatus carries out a plurality of types of inspections. The plurality of types of inspections may include a first, a second, and a third inspection. The first, second, and third inspections may be a pattern defect inspection, a foreign material inspection, and an inspection for a defect in a multilayer. The energy controller may control beam energies in the pattern defect inspection, the foreign material inspection, and the inspection for a defect in a multilayer to be energies $E1$, $E2$, and $E3$ different from one another.

As described above, the invention allows one inspection apparatus to carry out a plurality of types of inspections.

As described hereafter, other aspects of the invention exist. Thus, this summary of the invention is intended to provide a few aspects of the invention and is not intended to limit the scope of the invention described and claimed herein.

BRIEF DESCRIPTION OF THE DRAWINGS

The accompanying drawings are incorporated in and constitute a part of this specification. The drawings exemplify certain aspects of the invention and, together with the description, serve to explain some principles of the invention.

DETAILED DESCRIPTION

The following detailed description refers to the accompanying drawings. Although the description includes exemplary implementations, other implementations are possible and changes may be made to the implementations described without departing from the spirit and scope of the invention. The following detailed description and the accompanying drawings do not limit the invention. Instead, the scope of the invention is defined by the appended claims.

An aspect of the invention is an inspection method using a charged particle beam, and the method comprises: irradiating a charged particle beam onto an object to be inspected; detecting a signal obtained from the object to be inspected; and forming an image from the detected signal, wherein an identical charged particle beam inspection apparatus carries out a plurality of types of inspections. The plurality of types of inspections may include a first, a second, and a third inspection. The first, second, and third inspections may be a pattern defect inspection, a foreign material inspection, and an inspection for a defect in a multilayer, respectively, and in the first, second, and third inspections, charged particle beams having beam energies E1, E2, and E3 different from one another may be irradiated, respectively.

As described above, the charged particle beam inspection apparatus is an inspection apparatus that irradiates a charged particle beam onto an object to be inspected and forms an image from a signal obtained from the object to be inspected. The charged particle beam inspection apparatus may specifically be an inspection apparatus of a projection type, and the charged particle beam may be an electron beam. In a projection type inspection apparatus, the charged particle beam has a beam size (beam diameter) corresponding to a group of two-dimensional pixels, and the detected signal also corresponds to the group of two-dimensional pixels or those area. A projection type inspection apparatus can inspect fine defects, and can carry out a plurality of types of inspections. A plurality of types of inspections may be carried out with an identical sample being put on an identical stage and with an identical column being used. In this way, the invention allows one inspection apparatus to carry out a plurality of types of inspections.

In the invention, as described above, the plurality of types of inspections may include a first, a second, and a third inspection. The second and third inspections may be carried out after the first inspection. The first, second, and third inspections may be a pattern defect inspection, a foreign material inspection, and an inspection for a defect in a multilayer, respectively, and in the first, second, and third inspections, charged particle beams having beam energies E1, E2, and E3 different from one another may be irradiated, respectively. The invention thus allows inspections of three types or more to be suitably carried out by one inspection apparatus. Energy control is performed such that the three types of inspections are carried out with their respective suitable beam energies, and thus the three types of inspections are suitably carried out by one inspection apparatus.

The relation between the beam energies E1, E2, and E3 may be E1>E2 and E3>E2, and therefore energy control is performed such that the three types of inspections are carried out with their respective suitable beam energies, and thus the three types of inspections are suitably carried out by one inspection apparatus.

The inspections may be carried out in order of the pattern defect inspection, the foreign material inspection, and the inspection for a defect in a multilayer, and therefore the three types of inspections are suitably carried out by one inspection apparatus.

The irradiation area of a charged particle beam in the pattern defect inspection may be larger than the area where a pattern is located. Setting a large irradiation area allows beam irradiation of the pattern defect inspection to effectively serve as precharge for the foreign material inspection. The pattern defect inspection and the foreign material inspection can therefore be carried out effectively in succession.

Charge may be removed from the object to be inspected before at least one of the plurality of types of inspections. The charge removal may be performed between the plurality of types of inspections. The charge removal can put the object to be inspected into a homogeneous electric potential state before the next inspection, and therefore the plurality of types of inspections can suitably be carried out by one inspection apparatus.

The charge removal may be performed in a vacuum chamber. This configuration can eliminate a sequence of operations in which: the object to be inspected is returned from the vacuum chamber to the atmosphere; the charge removal is performed by using a gas in the atmosphere; and the object to be inspected is again transported to the vacuum chamber. In conventional art, one inspection apparatus would not carry out a plurality of types of inspections, so that no charge removal would be performed between a plurality of types of inspections. Unlike the conventional art, the invention provides an identical inspection apparatus carrying out a plurality of types of inspections, and the invention reduces processes required for the charge removal between inspections, can improve throughput, and improves efficiency in a case where a plurality of types of inspections are carried out by one inspection apparatus.

In the charge removal process, X-rays may be irradiated and a gas may be jetted onto a region from which charge is to be removed. That is, X-rays and the gas introduction may perform the charge removal, where X-rays may be irradiated onto a region from which charge is to be removed and a gas jet may be directed to the region from which charge is to be removed. Supplying a gas as well as X-rays allows the charge removal to be efficiently performed even in a vacuum. UV light may be irradiated instead of X-rays.

The charge removal may be performed by a charge remover (charge removal apparatus). The charge remover may include an X-ray irradiator and a gas supply unit, and the gas supply unit may be a gas jet nozzle. The gas supply unit may have an open/close valve and may control the open/close time of the open/close valve. The gas jet may be supplied in a pulsed manner by the valve control. This can reduce gas supply, and can reduce a decrease in the degree of vacuum associated with the charge removal.

The charge remover may include a guide for guiding X-rays and a gas to the charge removal region. The guide may include an X-ray mirror for guiding X-rays to an irradiation region, and a plurality of gas jet nozzles arranged around the X-ray mirror. This allows X-rays and a gas to be efficiently supplied to the charge removal region, reducing the amount of X-ray irradiation and gas supply. Since gas supply is reduced, a decrease in the degree of vacuum caused by the charge removal can be reduced to a minimum.

The charge removal may be performed in a transport chamber (a transfer chamber). The transport chamber may comprise a robot for transporting an object to be inspected to a main chamber where the inspection is to be carried out. The transport chamber may be provided between a load lock chamber and the main chamber. The transport chamber is at as high a degree of vacuum as the main chamber, thus effectively resulting in the advantages of the reduction in processes and improvement in throughput achieved by the charge removal in the vacuum chamber. Further, although the degree of vacuum decreases when a gas is introduced to the charge removal, the decrease in vacuum is caused to occur in the transport chamber, and therefore the degree of vacuum in the main chamber can be maintained. The invention is also advantageous in this respect. In this way, the plurality of types of inspections can suitably be carried out by one inspection apparatus.

The types of inspections are not limited to the above. For example, one of the plurality of types of inspections may be a "review." The review refers to inspecting in detail for defects found in another inspection, and the inspection conditions are set differently from those of the other inspection.

Another aspect of the invention is a mask inspection method for inspecting a mask being the object to be inspected, using the above-described inspection method.

Another aspect of the invention is a mask manufacturing method wherein an inspection is carried out in a mask manufacturing process by using the above-described inspection method.

Another aspect of the invention is a mask inspected by the above-described mask inspection method, or a mask manufactured by the above-described mask manufacturing method.

Another aspect of the invention is a semiconductor manufacturing method for manufacturing a semiconductor device, using the above-described mask.

Another aspect of the invention is a semiconductor device manufactured by using the above-described mask, or a semiconductor device manufactured by the above-described semiconductor manufacturing method.

The type of the mask includes, for example, a Cr mask, an EUV mask, or a nanoimprint mask. A Cr mask is used for optical exposure, an EUV mask is used for EUV exposure, and a nanoimprint mask is used for forming a resist pattern by means of nanoimprint lithography. Each of these masks having a pattern formed thereon may be a target of the inspections. A target of the inspections may be a mask in a state where a layer is formed but a pattern is not yet formed thereon (mask blank).

These aspects can also provide the above advantages of the invention as well. The above-described various configurations of the invention may as well be applied to these aspects.

Another aspect of the invention is a charged particle beam inspection apparatus, and the apparatus comprises: a stage for supporting an object to be inspected; a charged particle beam source for irradiating a charged particle beam onto the object to be inspected; a detector for detecting a signal obtained from the object to be inspected; an image processor for forming an image from the signal obtained from the detector; and an energy controller for controlling the beam energy of the charged particle beam to be irradiated onto the object to be inspected, where an identical charged particle beam inspection apparatus carries out a plurality of types of inspections. This aspect can also provide the above advantages of the invention as well. The above-described various configurations of the invention may as well be applied to this aspect.

Another aspect of the invention is a mask inspection apparatus for inspecting a mask being the object to be inspected, using the above-described charged particle beam inspection apparatus.

Another aspect of the invention is a mask manufacturing apparatus wherein an inspection is carried out in a mask manufacturing process by using the above-described charged particle beam inspection apparatus.

Another aspect of the invention is a mask inspected by the above-described mask inspection apparatus, or a mask manufactured by the above-described mask manufacturing apparatus.

Another aspect of the invention is a semiconductor manufacturing apparatus for manufacturing a semiconductor device, using the above-described mask.

Another aspect of the invention is a semiconductor device manufactured by using the above-described mask, or a semiconductor device manufactured by the above-described semiconductor manufacturing apparatus.

These aspects can also provide the above advantages of the invention as well. The above-described various configurations of the invention may as well be applied to these aspects.

Now, a method and apparatus for a charged particle beam inspection according to an embodiment of the invention will be described with reference to the drawings.

FIRST EMBODIMENT

Figure 1:
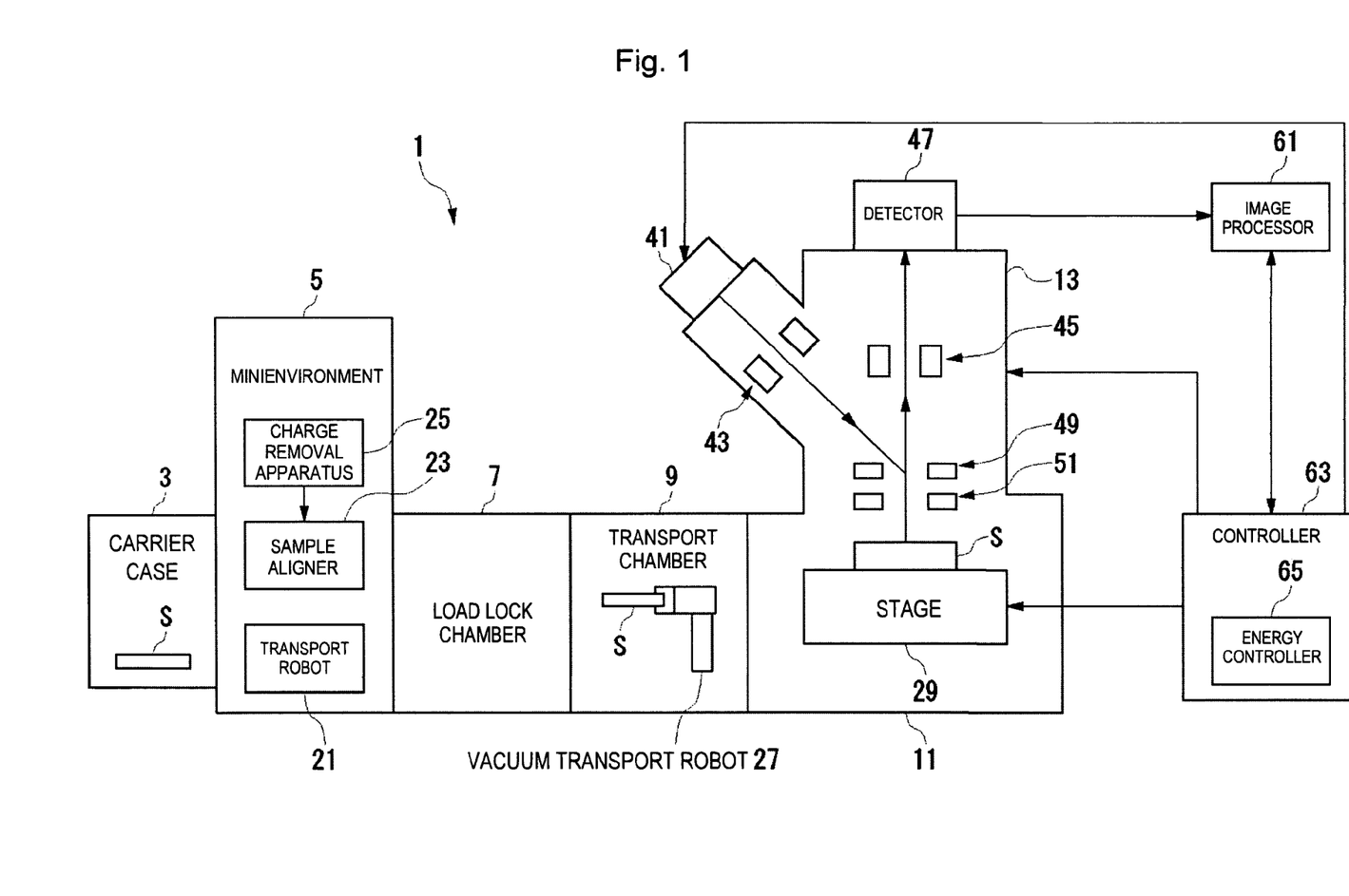
FIG. 1 shows a charged particle beam inspection apparatus according to an embodiment of the invention.

FIG. 1 shows a charged particle beam inspection apparatus according to the embodiment (hereinafter referred to simply as the inspection apparatus). In this example, the charged particle beam is an electron beam. As described later, the inspection apparatus 1 of the embodiment is an apparatus not of an SEM type but of a projection type.

As shown in FIG. 1, the inspection apparatus 1 comprises as main components a carrier case 3, a minienvironment 5, a load lock chamber 7, a transport chamber (transfer chamber) 9, a main chamber 11, and an electron beam column 13.

The carrier case 3 is configured to hold a sample S. The sample S corresponds to the object to be inspected (or the inspected object) of the invention and is, for example, a "mask" to be used for semiconductor manufacturing.

The minienvironment 5 (preliminary environmental chamber) comprises a transport robot 21, a sample aligner 23, and a charge removal apparatus 25 (corresponding to the charge remover of the invention). The transport robot 21 transports the sample S from the carrier case 3 to the sample aligner 23. The sample aligner 23 roughly positions the sample S. The transport robot 21 further transports the sample S from the sample aligner 23 to the load lock chamber 7. The charge removal apparatus 25 irradiates X-rays or UV light onto the sample S to remove charge therefrom. The charge removal will be described later. In the minienvironment 5, a downflow of clean air is supplied whose dust is removed by a high efficiency filter or the like, in order to reduce sticking of particles to the sample S.

The load lock chamber 7, the transport chamber 9, and the main chamber 11 are connected to a vacuum system. The vacuum system comprises a dry pump, a turbomolecular pump (TMP), a valve, and the like. The transport chamber 9 comprises a vacuum transport robot 27 for transporting the sample S in a vacuum. Moreover, the load lock chamber 7, the transport chamber 9, and the main chamber 11 are separated from one another with partition walls that can be opened and closed, though not shown in the figure.

The sample S is transported from the minienvironment 5 to the load lock chamber 7, which is then evacuated to a vacuum. After that, the vacuum transport robot 27 of the transport chamber 9 transports the sample S from the load lock chamber 7 through the transport chamber 9 to the main chamber 11. The transport chamber 9 and the main chamber 11 are maintained at a high vacuum. The main chamber 11 has a stage 29, on which the sample S is placed. The stage 29 is configured to move the sample S in horizontal directions, and moves the sample S in the X, Y, and θ directions. The X and Y directions are directions along axes perpendicular to each other. θ is an angle around an axis of rotation, that is, the sample S is also rotationally transferred.

The electron beam column 13 is connected to the upside of the main chamber 11. The electron beam column 13 comprises an electron gun 41, a primary lens system 43, a secondary lens system 45, and a detector 47. The electron gun 41 forms the charged particle beam source of the invention. The electron gun 41 and the primary lens system 43 comprise an electron beam irradiation system, and irradiate an electron beam onto the sample S. The electron beam is deviated by a Wien filter 49, passes through an objective lens system 51, and is irradiated onto the sample. Being irradiated with the electron beam, the sample S emits a signal having information on the sample S. The signal is, for example, a secondary electron, a reflected electron, or a mirror electron. This signal passes through the objective lens system 51, the Wien filter 49, and the secondary lens system 45, reaches the detector 47, and is detected by the detector 47.

The detector 47 is connected to an image processor 61, and provides the image processor 61 with the detected signal. The image processor 61 comprises a computer having an image processing function, and performs a defect inspection process. That is, the image processor 61 forms an image of the sample from the signal detected by the detector 47, and then processes the image of the sample to detect and determine a defect.

As shown in FIG. 1, the inspection apparatus 1 has a controller 63. The controller 63 comprises a computer and is configured to control the whole inspection apparatus 1 to carry out the inspection. As illustrated, the controller 63 controls the electron beam column 13, the main chamber 11, and the image processor 61. The controller 63 thus causes the sample S to be moved, causes the sample S to be irradiated with the electron beam, and causes the image processor 61 to generate the image of the sample S.

The controller 63 can control the inspection conditions, and particularly controls the beam energy of the electron beam, magnification, and dose amount, and the like. Specifically, the beam energy is the landing energy at which the electron beam is irradiated onto the sample S. The energy control may be performed by an energy controller 65 provided in the controller 63.

In the embodiment, the inspection apparatus 1 is an inspection apparatus of a projection type. In an inspection apparatus of a projection type, the electron beam has a beam size (beam diameter) corresponding to a group of two-dimensional pixels, that is, has a certain level of size. The irradiation area on the sample also has an area corresponding to the group of two-dimensional pixels. The signal detected by the detector 47 also corresponds to the group of two-dimensional pixels or those area. The detector 47 has a sensing capability corresponding to the group of two-dimensional pixels or those area and comprises, for example, a CCD having a two-dimensional sensing surface.

The inspection apparatus of a projection type will be compared with an inspection apparatus of an SEM type. In an SEM, the electron beam is thin and corresponds to one pixel. In an SEM, the electron beam is scanned to repeat the measurement for one pixel, and the measurement values are collected to provide an image of the sample. An SEM is used for a pattern defect inspection. However, it would take too long to use an SEM for a particle or other foreign material inspections. In addition, no method of using an SEM for an inspection for a defect in a multilayer has been suggested so far. In short, an inspection apparatus of an SEM type is only used for a pattern defect inspection.

As described above, the electron beam has a beam size of one pixel in an SEM type inspection apparatus. In contrast to this, in a projection type inspection apparatus, the electron beam has a beam size corresponding to a group of a plurality of pixels. Like an SEM type inspection apparatus, a projection type inspection apparatus can inspect fine defects. The use of a projection type inspection apparatus is not limited to a pattern defect, but it can carry out a plurality of types of inspections. A projection type inspection apparatus can be used for a particle or other foreign material inspections, and further for an inspection for a defect in a multilayer as described later. An inspection for a defect in a multilayer may be referred to as an in-multilayer defect inspection or simply a multilayer defect inspection hereafter.

In the embodiment, the inspection apparatus 1 is thus used to carry out the plurality of types of inspections. The controller 63 stores inspection conditions corresponding to each of the plurality of types of inspections, and changes the inspection conditions depending on the type of inspection. As described before, the inspection conditions are the beam energy of the electron beam, magnification, and dose amount, and the like. The image processor 61 stores defect inspection algorithms (software) corresponding to each of the plurality of types of inspections, and executes an algorithm corresponding to a type of inspection in accordance with an instruction from the controller 63. Specifically, the controller 63 stores the inspection conditions of the pattern defect inspection, foreign material inspection, and in-multilayer defect inspection shown above, and the image processor 61 has algorithms for these inspections. The pattern defect inspection, the foreign material inspection, and the in-multilayer defect inspection correspond to the first, second, and third inspections of the invention.

There has been described a configuration of the inspection apparatus 1. An outline of the operation of the inspection apparatus 1 will next be described. The sample S being the object to be inspected is first held by the carrier case 3. The sample S is transported by the transport robot 21 of the minienvironment 5 to the sample aligner 23, where the sample S is roughly positioned. The charge removal apparatus 25 removes charge from the sample S. The sample S is transported by the transport robot 21 to the load lock chamber 7. When the load lock chamber 7 becomes a vacuum state, the sample S is transported by the vacuum transport robot 27 of the transport chamber 9 to the main chamber 11.

In the main chamber 11, the sample S is placed on the stage 29, and the inspection of the sample S is carried out. An electron beam is irradiated onto the sample S, a signal from which is detected by the detector 47. The signal detected by the detector 47 is sent to the image processor 61. The image processor 61 generates an image of the sample S from the detected signal, and further performs a process of detection and determination of defects by means of image processing.

The controller 63 controls the inspection apparatus 1 to carry out the plurality of types of inspections. The controller 63 changes the inspection conditions, such as the beam energy of the electron beam, magnification, and dose amount, depending on the type of inspection. The image processor 61 executes inspection algorithms varying from one type of inspection to another to generate an image and to detect and determine defects from the image.

In the example of the embodiment, the sample S, i.e. the object to be inspected, is a mask. The inspection apparatus may be suitably provided in a mask manufacturing apparatus. The mask manufacturing apparatus carries out a mask manufacturing method. In this mask manufacturing method, an inspection is performed for each process of mask production by using the above-described inspection method. The mask manufactured by the mask manufacturing method is then used to manufacture a semiconductor device.

Figure 2A:
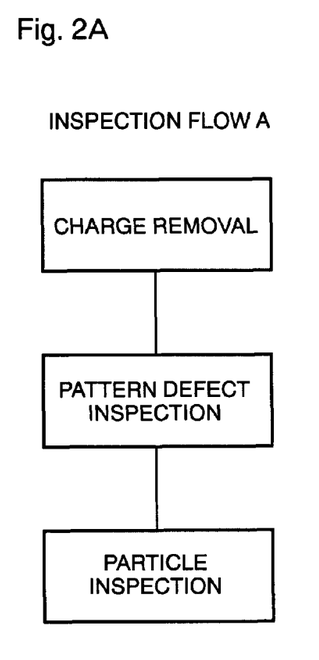
FIG. 2A shows an inspection flow A performed by the inspection apparatus in FIG. 1.
Figure 2B:
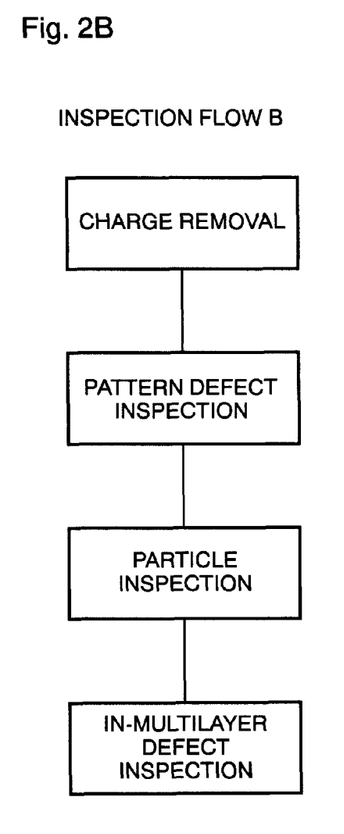
FIG. 2B shows an inspection flow B performed by the inspection apparatus in FIG. 1.

The inspection process of the inspection apparatus 1 will next be described in more detail with a concrete example of the inspection flow. FIGS. 2A and 2B show inspection flows A and B, respectively.

As illustrated, the inspection flow A performs the charge removal, a pattern defect inspection, and a particle inspection in order. The particle inspection is one example of the foreign material inspection. The inspection flow B additionally carries out an in-multilayer defect inspection.

In the inspection flows A and B, the order of inspection is set such that the plurality of types of inspections can be carried out efficiently. Particularly, the beam energies (landing energies) as electron beam irradiation conditions are set as described below, and this allows the inspections to be carried out efficiently as described later:

$E1>E2$ and $E3>E2$ where $E1$: the beam energy in the pattern defect inspection;
$E2$: the beam energy in the particle inspection; and
$E3$: the beam energy in the in-multilayer defect inspection.

In the following, each of the charge removal, pattern defect inspection, particle inspection, and in-multilayer defect inspection will be further described, and the above-mentioned beam energy condition will be described in detail.

The charge removal process is performed in the minienvironment 5 by the charge removal apparatus 25. In the charge removal process, an insulator of the sample S is charged up to neutralize the accumulated charge, causing the sample S to be put into a homogeneous electric potential state. Various methods can be applied to this charge removal. For example, the charge removal is known which is performed with X-ray irradiation and UV light irradiation. The X-ray or UV light irradiation generates free electrons within a solid to form a conductive state, achieving neutralization of the charge and homogenization of the electric potential. X-ray or UV light irradiation generates charged particles (positive ions, negative ions, and electrons) around the surface of the sample to provide the effect of neutralizing the charged-up region or the like.

Figure 3:
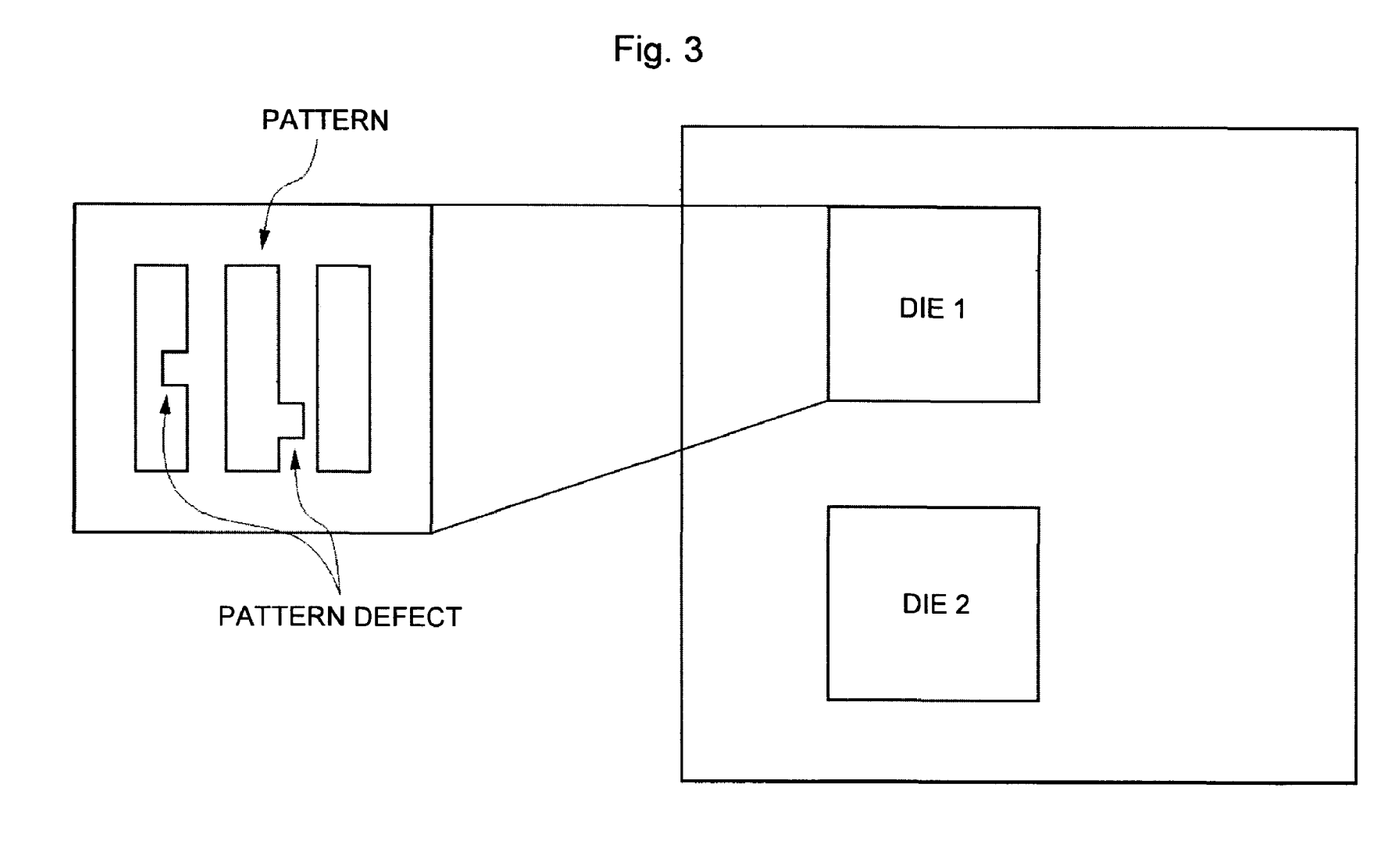
FIG. 3 shows a pattern defect inspection process.

The pattern defect inspection will next be described. As shown in FIG. 3, in the pattern defect inspection, an image of a pattern on the sample is generated to determine the presence or absence of a pattern defect. The beam energy $E1$ in the pattern defect inspection is set so as to provide a good pattern image.

In FIG. 3, there are a plurality of dies on the sample. The dies are areas where patterns are formed. The same patterns are formed on the plurality of dies. Identical regions of the plurality of dies are compared with each other in the pattern defect inspection. If a difference occurs in their pattern signals, the inspection apparatus 1 determines that there is a defect in a region where the difference in the signals has occurred.

More specifically, the example in FIG. 3 shows a die 1 and a die 2. A comparison image may be generated in order to compare the regions of the identical patterns of the dies 1 and 2 with each other. The comparison image is an image of a difference between images of the dies 1 and 2. A signal of a defect region is detected from the comparison image to determine the defect.

In the above example, the dies are compared with each other. In another inspection method, an image of a die may be compared with CAD data, which has no defect. An inspection image obtained by the beam irradiation is compared with CAD data. If there is a difference between the inspection image and the CAD data, the inspection apparatus 1 determines that there is a defect in the region where the difference has been found.

The particle inspection will next be described. The amount of electrons detected by the detector 47 varies depending on the presence or absence of a particle. The electrons to be detected are, for example, a secondary electron or a mirror electron. This phenomenon is used to detect a particle from an image of the sample S. The beam energy $E2$ in the particle inspection is set such that the image considerably varies depending on the presence or absence of a particle.

In this regard, as described above, the beam energy $E1$ in the pattern defect inspection and the beam energy $E2$ in the particle inspection are set so as to satisfy the relation "$E1>E2$." This setting is advantageous in that a precharge effect for the particle inspection can be obtained by the electron beam irradiation of the pattern defect inspection.

The precharge will be described. The precharge performed before the particle inspection increases the potential difference between a particle and its surroundings. For example, if the particle is an insulator and the surrounding sample S is a conductor, the precharge increases the amount of charge of the particle. Accordingly, the precharge provides high detection accuracy and detection stability. The precharge is more effective when the energy of the precharge is higher than the beam energy applied during imaging. Thus, the effect of the charge-up voltage will be enhanced and the track of an emitted electron from the particle will greatly vary, providing a high S/N ratio.

In the embodiment, the pattern defect inspection is carried out before the particle inspection. The beam energy $E1$ in the pattern defect inspection is larger than the beam energy $E2$ in the particle inspection. Therefore, the beam irradiation of the pattern defect inspection serves as precharge for the particle inspection. As a result, electron beam irradiation for precharge for the particle inspection can be omitted, and these two types of inspections can be effectively carried out.

In the embodiment, the beam irradiation area in the pattern defect inspection is suitably set as described below, in order to increase the precharge effect.

Figure 4:
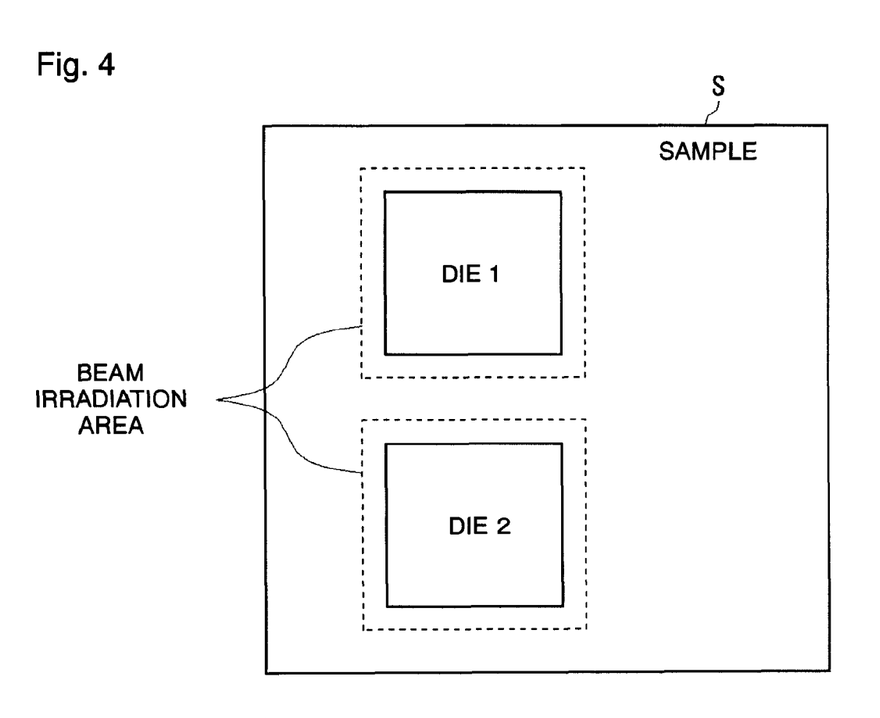
FIG. 4 shows a beam irradiation area in the pattern defect inspection.

FIG. 4 shows a beam irradiation area in the pattern defect inspection. In the example in FIG. 4, the topmost surface of the sample is, for example, an oxidized layer or other insulating material. A die is an area where a pattern is formed, and is an area to be inspected by the pattern defect inspection. A care area (area to be inspected) in the particle inspection is also a pattern-formed area, that is, a die.

In this case, if a pattern defect only is to be inspected, the beam irradiation area in the pattern defect inspection may be the same as a die area. In the embodiment, however, the beam irradiation area in the pattern defect inspection is set larger than the die area as shown in FIG. 4, and the electron beam is also irradiated onto the area outside the die. The width of the outside area may be constant and is, for example, 5 to 500 μm.

The electron beam irradiated onto the die area and the outside area thereof in this way enhances the homogeneity of the surface potential state in the care area (=die area) in the particle inspection, allowing the accuracy of the particle inspection to be improved. The setting of the beam irradiation area in FIG. 4 is therefore advantageous when the pattern defect inspection and the particle inspection are carried out in sequence as in the case of the embodiment, and can increase the precharge effect to improve the inspection accuracy.

The inspection for a defect in a multilayer (the in-multilayer defect inspection) will next be described. This inspection detects a defect within a multilayer. A multilayer is, for example, a 40-tier Mo/Si (3 nm/4 nm) layer. The defect is, for example, a foreign material in a layer or a flaw in a layer. When the electron beam is irradiated onto the sample S, a potential change occurs in the defect region. For example, if the defect is an insulating foreign material, the charging up forms a deformation in the surface electric field. The electron beam irradiation thus changes the potential of the surface of the sample depending on the presence or absence of a defect in a layer. The inspection apparatus 1 then processes an image obtained from a signal from the detector 47 to detect a defect by the distribution of the surface potential.

Figure 5:
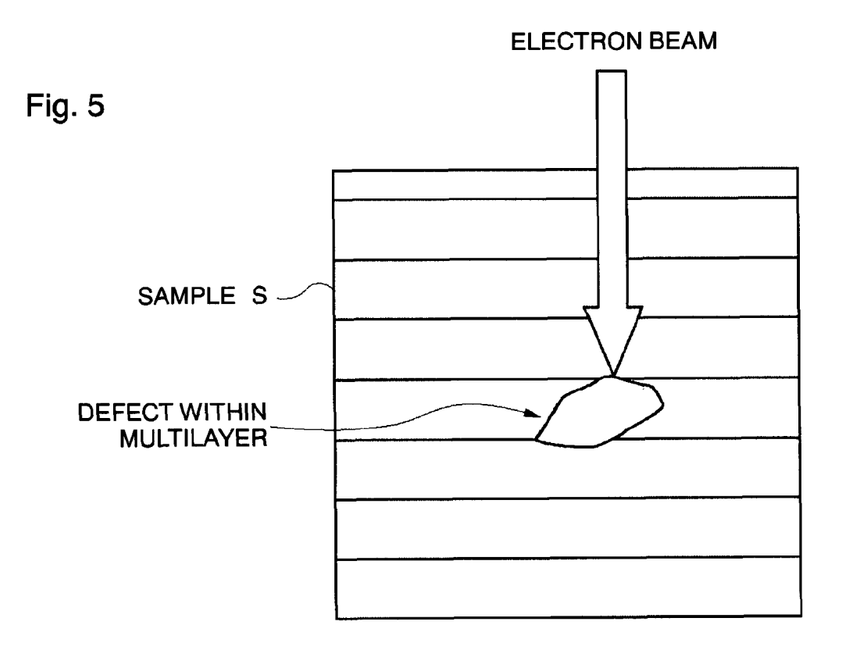
FIG. 5 shows electron beam irradiation of an inspection for a defect in a multilayer.

It is desirable in the in-multilayer defect inspection to form a high potential distribution. For that purpose, it is effective to raise the energy of the electron beam, so that the electron beam can reach a defect region in a low layer, as shown in FIG. 5. In the embodiment, the beam energy E3 in the in-multilayer defect inspection is set larger than the beam energy E2 in the particle inspection that is to be carried out in the previous step (E3>E2). This allows the beam energy E3 to be set to an appropriate large value with which there will be no effect of the beam irradiation of the pattern defect inspection and particle inspection. The influence of the large beam energy E3 on the other inspections can also be avoided. The electron beam can thus be caused to reach a defect region in layers to detect a defect in a layer.

The in-multilayer defect inspection has not been carried out with a conventional inspection apparatus of an SEM type. No effective inspection method has been suggested so far. In the embodiment, the in-multilayer defect inspection can be carried out by using the inspection apparatus of a projection type and by appropriately setting the beam energy E3 as described above.

Examples of specific values of the beam energies will next be shown. As having been described above, the suitable beam energy conditions would be E1>E2 and E3>E2 (E1: pattern defect inspection, E2: particle inspection, E3: in-multilayer defect inspection). Preferable conditions are E1=10 to 3000 eV, E2=-10 to 500 eV, and E3=500 to 5000 eV.

When the beam energies are selected, E2 is preferably set to a value between -10 and 500 eV. E1 and E3 are then set according to E2 such that the relation E1>E2 and E3>E2 is realized. Such settings are effective particularly when a mirror electron is used in the particle inspection. E2 is set such that a mirror electron is formed at a particle, and E1 and E3 are set according to E2. In this way, the three beam energy values can be set such that the three types of inspections can suitably be carried out. A particularly preferable condition is E2=-5 to 20 eV, which causes the formation of mirror electrons to efficiently occur at a particle. One typical example is E1=500 eV, E2=3 eV, and E3=3000 eV.

The above is a detailed description of the inspection flows A and B in FIGS. 2A and 2B. As described so far, in the embodiment, the order of inspection is set appropriately, and the beam energies are also set appropriately, allowing the plurality of types of inspections to be efficiently carried out.

In summary on this point, in the embodiment, the pattern defect inspection is placed before the particle inspection, and the beam energy E1 in the pattern defect inspection is set larger than the beam energy E2 in the particle inspection. Consequently, the beam irradiation of the pattern defect inspection serves as precharge for the particle inspection, and electron beam irradiation for precharge for the particle inspection can be omitted. In addition, the in-multilayer defect inspection is placed after the particle inspection, and the beam energy E3 in the in-multilayer defect inspection is set larger than the beam energy E2 in the particle inspection. This allows the beam energy E3 to be set to an appropriate large value with which there will be no effect of the beam irradiation of the pattern defect inspection and particle inspection. The influence of the large beam energy E3 on the other previous inspections can also be avoided. The electron beam can thus be caused to reach a defect region in layers to detect a defect in a layer. In the embodiment, the plurality of types of inspections can thus be effectively carried out by the identical inspection apparatus 1 by appropriately setting the order of inspection and the beam energy settings.

Figure 6A:
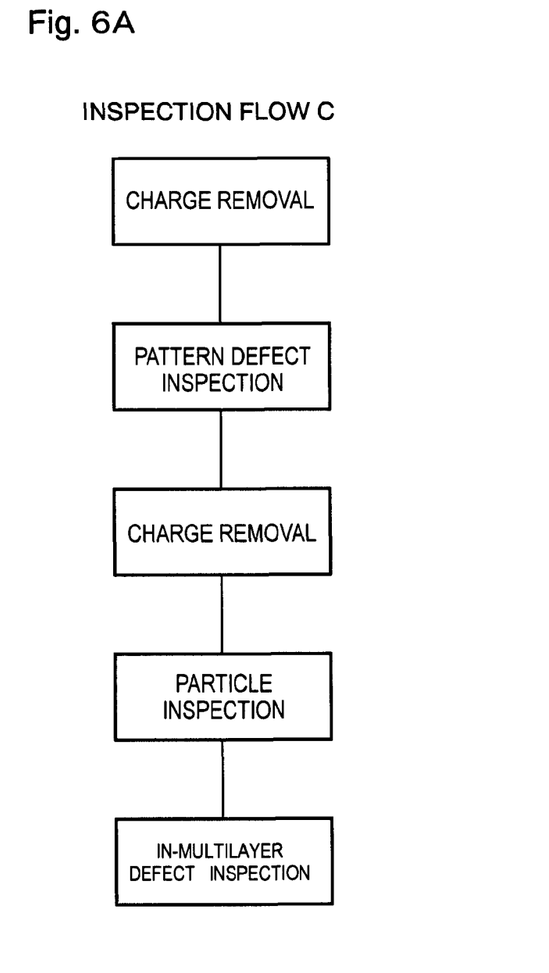
FIG. 6A shows an inspection flow C performed by the inspection apparatus in FIG. 1.

Now, FIGS. 6A and 6B show other inspection flow examples. In an inspection flow C in FIG. 6A, a charge removal process is added between the pattern defect inspection and the particle inspection. This inspection flow C is used suitably when the value of the beam energy E1 in the pattern defect inspection is not suitable for precharge for the particle inspection. For example, it can be considered that the beam energy E1 is too large for precharge. In such a case, the charge removal is performed after the pattern defect inspection. For the charge removal, the sample S is returned from the main chamber 11 to the minienvironment 5. After the charge removal, the sample S is again transported to the main chamber 11, and the particle inspection is carried out. Precharge is performed at that time as required.

Figure 6B:
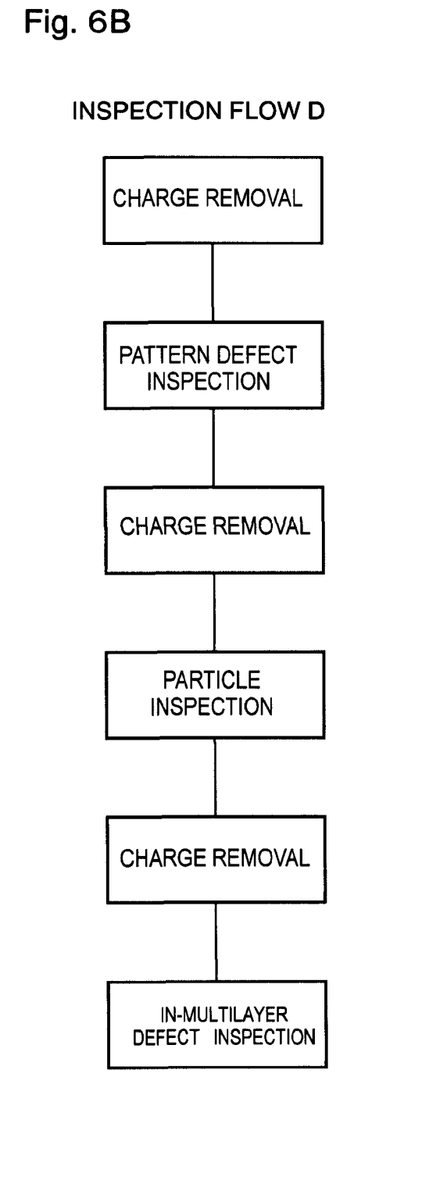
FIG. 6B shows an inspection flow D performed by the inspection apparatus in FIG. 1.

In an inspection flow D in FIG. 6B, another charge removal is added between the particle inspection and the in-multilayer defect inspection. After the particle inspection, the sample S is returned to the minienvironment 5, the charge removal is performed, the sample S is then transported to the main chamber 11, and the in-multilayer defect inspection is carried out. The inspection flow D is useful when the beam irradiation of the pattern defect inspection and particle inspection has an influence on the in-multilayer defect inspection. The inspection flow D can eliminate the influence of the beam irradiation in the previous inspections and improve the accuracy and stability of the in-multilayer defect inspection.

SECOND EMBODIMENT

Another embodiment of the invention will next be described with reference to FIG. 7. In the first embodiment, the charge removal apparatus is provided in the minienvironment. On the other hand, in the present embodiment, the charge removal apparatus is provided in the transport chamber. Subject matter common to the first embodiment will not be described.

Figure 7:
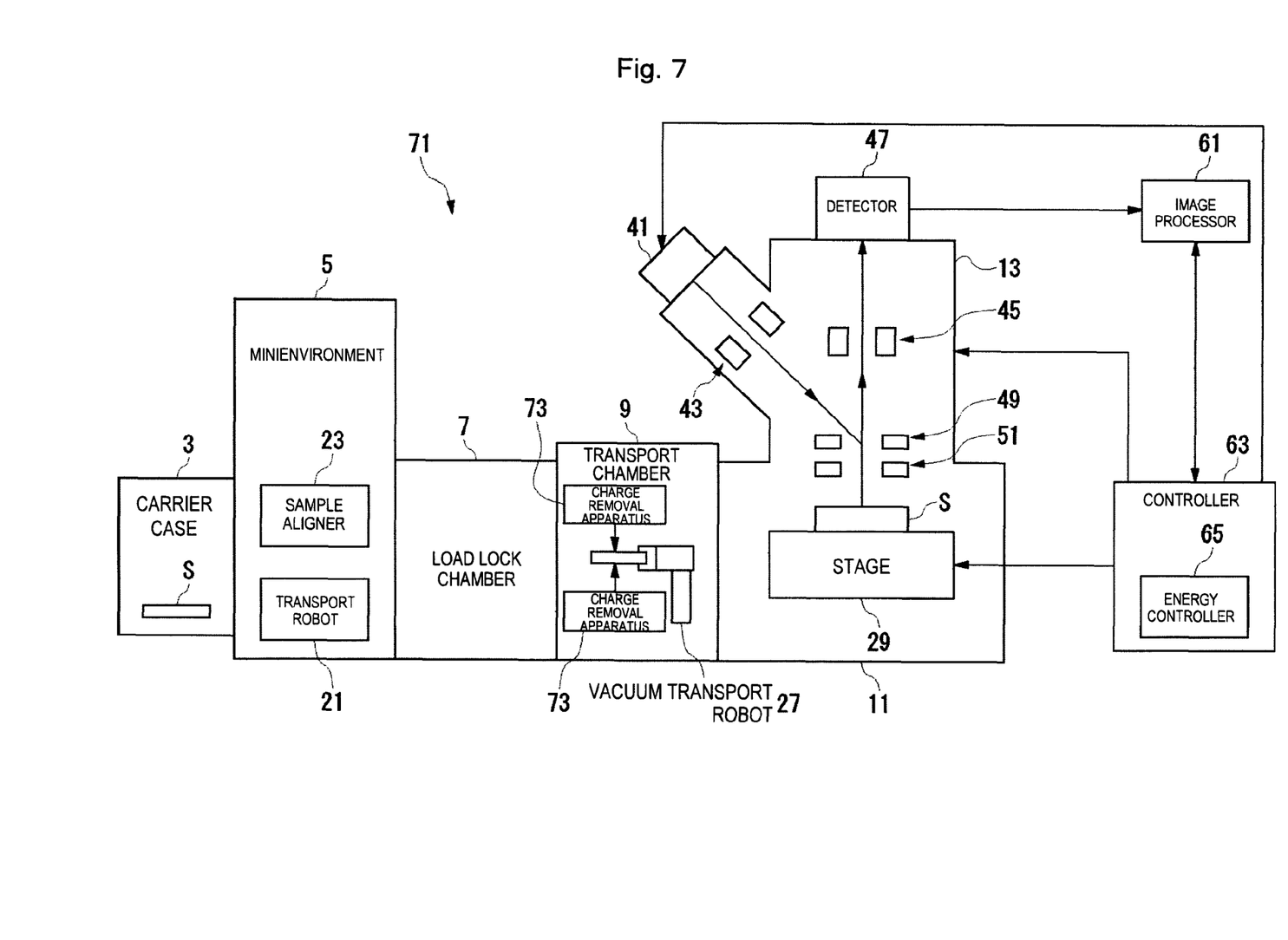
FIG. 7 shows an inspection apparatus according to a second embodiment of the invention.

FIG. 7 shows an inspection apparatus 71 of the embodiment. The inspection apparatus 71 has two charge removal apparatuses 73 provided in the transport chamber 9 and arranged above and below the sample S, and these two charge removal apparatuses 73 remove charge from the top surface and undersurface of the sample S, respectively. This can rapidly remove charge from the whole surface of the sample S, allowing the homogeneity of the potential of the sample S to be improved.

The charge removal apparatuses 73 in FIG. 7 can perform the charge removal on the sample S while the sample S is being transported by the vacuum transport robot 27. A sample table (not shown) may be provided in the transport chamber 9, and the vacuum transport robot 27 may place the sample S on the table so that the charge removal may be performed on the sample S on the table.

The transport chamber 9 is a vacuum chamber and therefore, in the embodiment, the charge removal apparatuses 73 are required to operate in a vacuum. In this regard, the charge removal apparatuses 73 are different from conventional common charge removal apparatuses and from the charge removal apparatus 25 of the first embodiment. A conventional, common, and commercially available charge removal apparatus is configured to, for example, operate in the atmosphere, and irradiates a gas in the atmosphere with X-rays or UV light to cause the charge removal effect. The charge removal apparatus 25 of the first embodiment is also provided in the atmosphere (minienvironment), and a conventional commercially available charge removal apparatus can be applied thereto. On the other hand, in the present embodiment, the charge removal apparatuses 73 are provided in the vacuum transport chamber 9, and are configured to operate in a vacuum.

Practically, the charge removal apparatuses 73 may be configured to irradiate X-rays onto the sample S in a vacuum. X-rays have, for example, an energy of 100 to 100000 eV. The thickness of a multilayer is, for example, 100 nm (10 nm multiplied by 10 layers). The X-ray irradiation generates free electrons in the layer, causing the X-ray irradiated region to be electrically conductive. The conduction causes the sample to change from a state where charge is accumulated in its insulating layer to a state where its potential is at the same level as the applied voltage. The X-ray irradiation in a vacuum can thus provide the charge removal effect.

As described above, the X-ray irradiation alone can provide the charge removal effect. However, in order to efficiently perform the charge removal, it is suitable to introduce a gas for the charge removal as described below.

Figure 8:
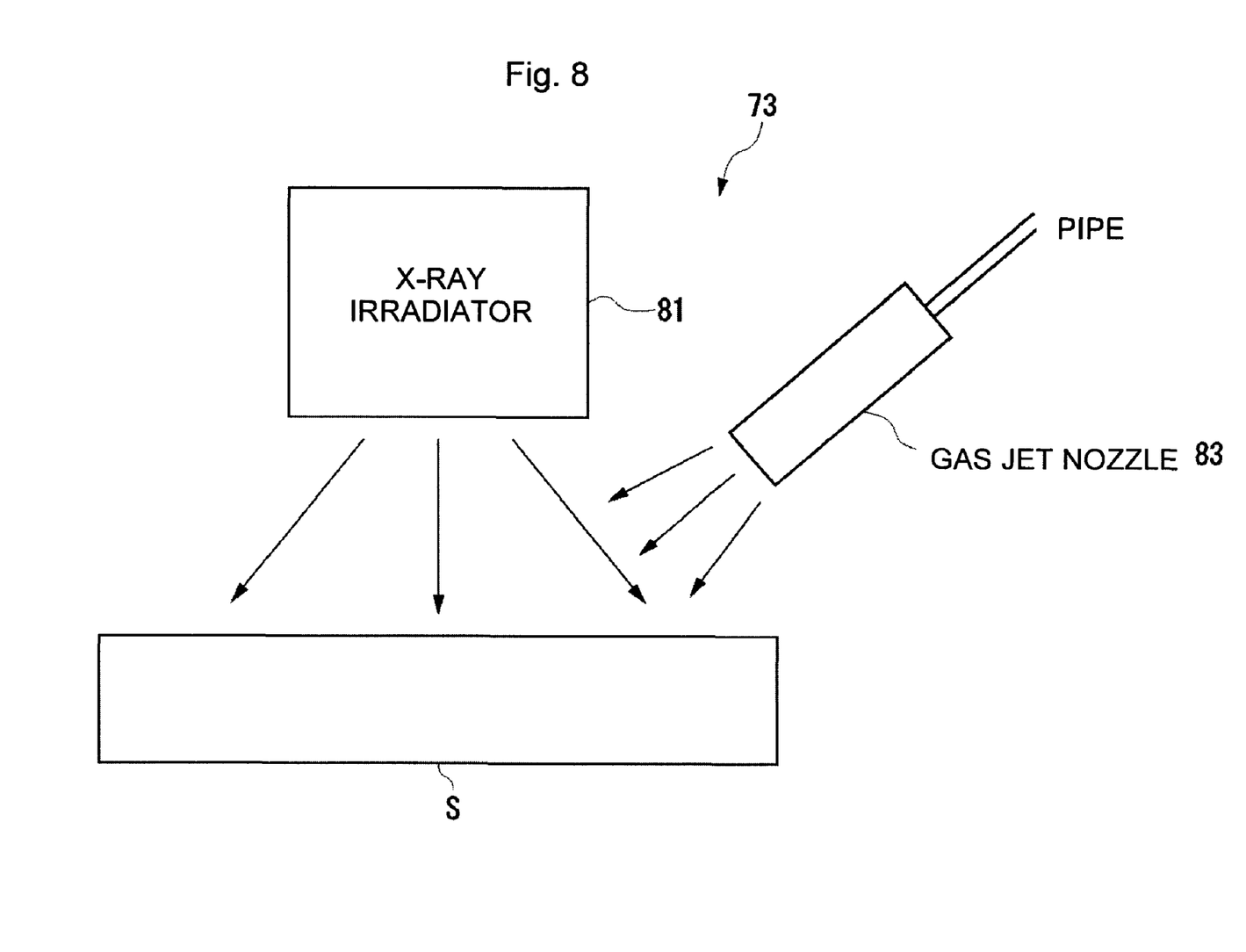
FIG. 8 shows a configuration example of a charge removal apparatus suitable for use in a vacuum chamber.

FIG. 8 is a configuration example of the charge removal apparatus 73 which is suitable for operating in a vacuum. The charge removal apparatus 73 is configured to introduce a small amount of gas to enhance the effect of the charge removal. The charge removal apparatus 73 comprises an X-ray irradiator 81 and a gas jet nozzle 83. The gas jet nozzle 83 is one example of the gas supply unit. The X-ray irradiator 81 irradiates X-rays onto a charge removal region (a region from which charge is to be removed), and the gas jet nozzle 83 jets a gas onto the charge removal region. The gas is supplied from a pipe to the gas jet nozzle 83. A gas that has no bad effect on the sample S is used. A suitable gas is a gas that does not adhere to the surface of the sample S and causes no chemical change. For example, air, nitrogen, argon, or oxygen is used.

A gas is supplied to the surface of the sample by the above-described gas jet, and X-rays are irradiated onto the surface of the sample. Around the surface of the sample, gas particles are ionized by the X-rays to generate charged particles (positive ions, negative ions, and electrons). These charged particles are supplied to the sample surface on which charge is accumulated, and neutralizes the charge, effectively achieving the charge removal.

The gas supply unit may be provided with a high-speed open/close valve (not shown in the figure) to periodically perform an open/close control. The valve is suitably provided upstream of the gas jet nozzle 83. This allows the gas to be supplied intermittently in a pulsed manner. The pulsed gas supply can minimize gas supply, and can reduce a decrease in the degree of vacuum (increase in pressure) to a minimum.

The charge removal apparatus 73 in FIG. 8 is suitably provided within the vacuum chamber. X-rays are generated by an X-ray generator also in a vacuum. There is no need for a configuration for introducing X-rays from outside the chamber to inside the chamber, so that an X-ray window on the chamber wall is not required. An electric circuit or the like that has a bad effect on the vacuum may be placed in the atmosphere, and may be connected via a hermetic seal. An electric circuit or the like in the chamber may be sealed with resin molding to prevent contaminant components from being generated in the vacuum.

The charge removal apparatus 73 in FIG. 8 irradiates X-rays. However, the charge removal apparatus 73 may be configured to irradiate UV light.

An operation of the inspection apparatus 71 of the embodiment shown in FIG. 7 will next be described. The operation of the inspection apparatus 71 of the embodiment may be generally the same as the first embodiment except the charge removal.

The inspection apparatus 71 of the embodiment carries out the plurality of types of inspections. The charge removal is performed before the first inspection and further between the plurality of types of inspections (see FIGS. 6A and 6B).

The charge removal before the first inspection is performed in the transport chamber 9 in the process of sending the sample S from the minienvironment 5 to the main chamber 11. X-rays are irradiated onto the sample S when the charge removal is performed. As shown in FIG. 8, a gas may be supplied together with the X-ray irradiation.

When the charge removal is performed between the plurality of types of inspections, the vacuum transport robot 27 of the transport chamber 9 transports the sample S from the main chamber 11 to the transport chamber 9, in which the charge removal is performed. After the charge removal, the sample S is returned to the main chamber 11, and the next inspection is carried out.

As described above, in the embodiment, the charge removal apparatuses 73 are provided in the transport chamber 9, and the charge removal is performed on the sample S during transport. This allows the charge removal to be performed in a sequence of transport operations, and without a loss in transport time.

Further advantages of the invention will be described. The transport chamber 9 is a vacuum chamber of the inspection apparatus 71 as well as the load lock chamber 7 and the main chamber 11. That is, the charge removal apparatuses 73 are provided in the vacuum chamber. This configuration is particularly advantageous in the inspection apparatus 71 that carries out the plurality of types of inspections as in the invention. Since the charge removal between the plurality of inspections is carried out in a vacuum, the charge removal can be performed rapidly, and throughput of the inspection apparatus 71 can be improved.

The above-described advantage of the invention is apparent when compared to the first embodiment in FIG. 1. In the first embodiment, the charge removal apparatus 25 is provided in the minienvironment 5. In the charge removal process, the sample S is returned from the main chamber 11 to the minienvironment 5. After the charge removal, the sample S is moved to the load lock chamber 7, which is evacuated to a vacuum. After the evacuation is completed, the sample S is transported to the main chamber 11. Such an operation is complicated and takes a long time. On the other hand, in the present embodiment, the charge removal is performed in the vacuum transport chamber 9. The transport to an atmospheric space is not required. Consequently, the charge removal can be performed easily and rapidly.

The invention will be further described by comparing it with conventional common inspection apparatuses. A conventional inspection apparatus is configured to carry out only one type of inspection. In such a case, the charge removal is required to be performed only once before the start of inspection. The charge removal is therefore performed only once by means of a charge removal apparatus provided in the atmosphere, such as a minienvironment. Thus, a conventional inspection apparatus would not require the charge removal apparatus to be arranged in a vacuum chamber. On the other hand, in the invention, the inspection apparatus 71 is configured to perform the charge removal between the plurality of types of inspections. In the thus configured inspection apparatus 71, a configuration is effective in which the charge removal apparatuses 73 are arranged in the vacuum chamber and, as described above, the charge removal operation can be simplified to reduce time required for the charge removal and improve throughput.

THIRD EMBODIMENT

Still another embodiment of the invention will next be described with reference to FIG. 9. In the following description, subject matter common to the first and second embodiments will be omitted.

Figure 9:
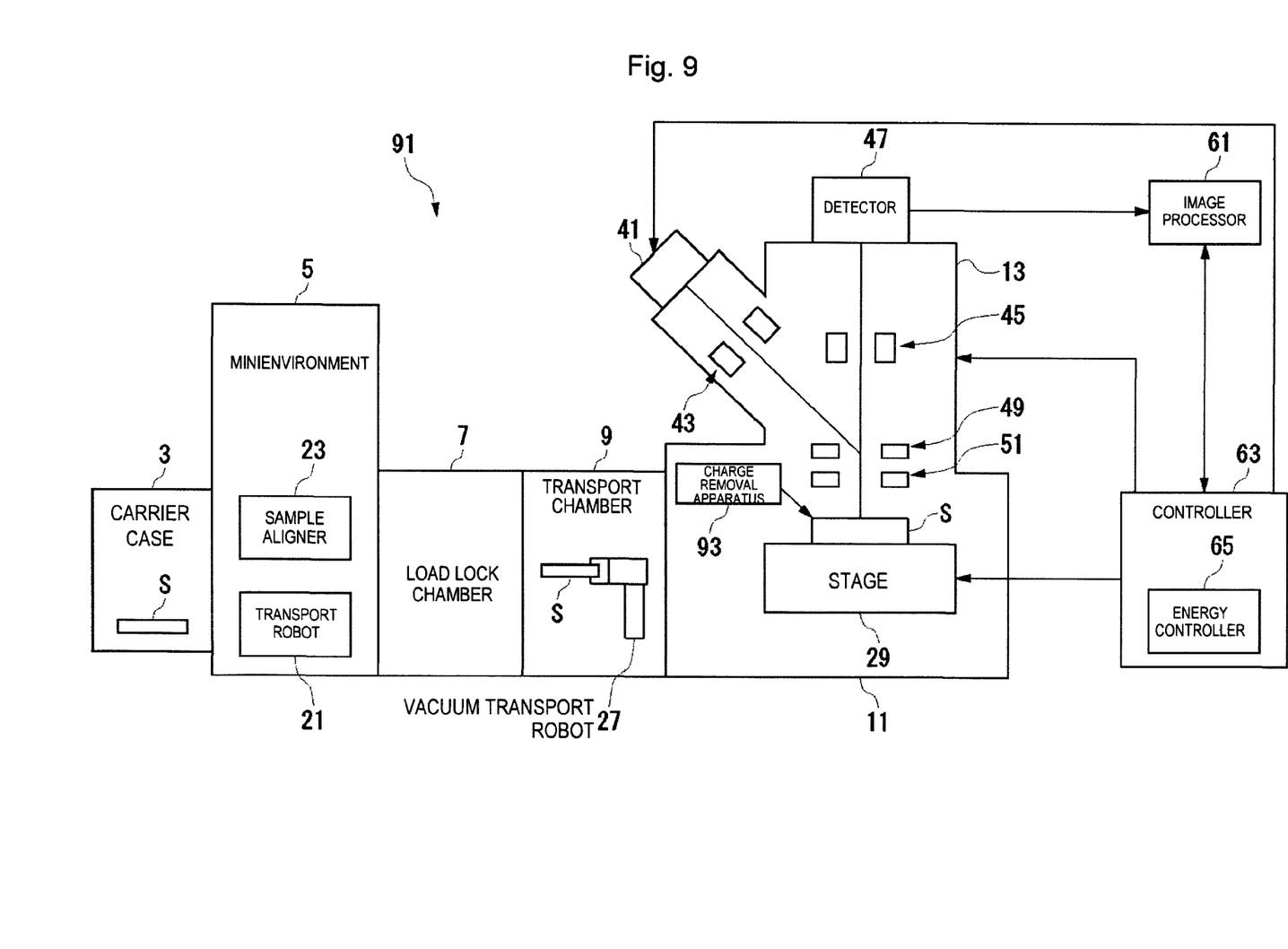
FIG. 9 shows an inspection apparatus according to a third embodiment of the invention.

FIG. 9 shows an inspection apparatus 91 of the embodiment. As illustrated, the arrangement of the charge removal apparatus is different between the present embodiment and the second embodiment. That is, in the inspection apparatus 71 of the second embodiment, the charge removal apparatuses 73 are provided in the vacuum chamber 9. On the other hand, in the inspection apparatus 91 of the present embodiment, a charge removal apparatus 93 is provided in the main chamber 11.

In the second embodiment, the two charge removal apparatuses 73 are arranged above and below the sample S. On the other hand, the one charge removal apparatus 93 is provided in the present embodiment. However, a plurality of charge removal apparatuses may also be provided in the embodiment within the scope of the invention.

In the embodiment, the charge removal is performed in the main chamber 11. the charge removal may be performed before the first inspection, or between the inspections. In either case, the charge removal is performed before the next inspection.

The charge removal apparatus 93 may perform the charge removal on the whole sample or on an inspection area only. The configuration of the charge removal apparatus 93 may be the same as the charge removal apparatus 73 of the second embodiment. That is, the charge removal apparatus 93 may be configured to irradiate X-rays onto the sample S in a vacuum. In addition, as shown in FIG. 8, the charge removal apparatus 93 may be configured to supply a gas as well as to irradiate X-rays.

In the embodiment, it is particularly suitable to arrange the charge removal apparatus 93 such that the charge removal is performed immediately before the irradiation at a front section of the irradiation region of the electron beam for the inspections. The "front section" is a place downstream of the beam irradiation region along the traveling direction of the inspections, and is a place to be subsequently irradiated with the electron beam. This allows the inspections to be carried out while the charge removal is being performed, allowing the charge removal to be performed online. In this online charge removal, the charge removal is suitably performed locally at the front section of the irradiation region of the electron beam. X-rays and the gas are supplied onto the local charge removal region, and an effective charge removal can thus be performed with a minimum amount of gas.

Figure 10:
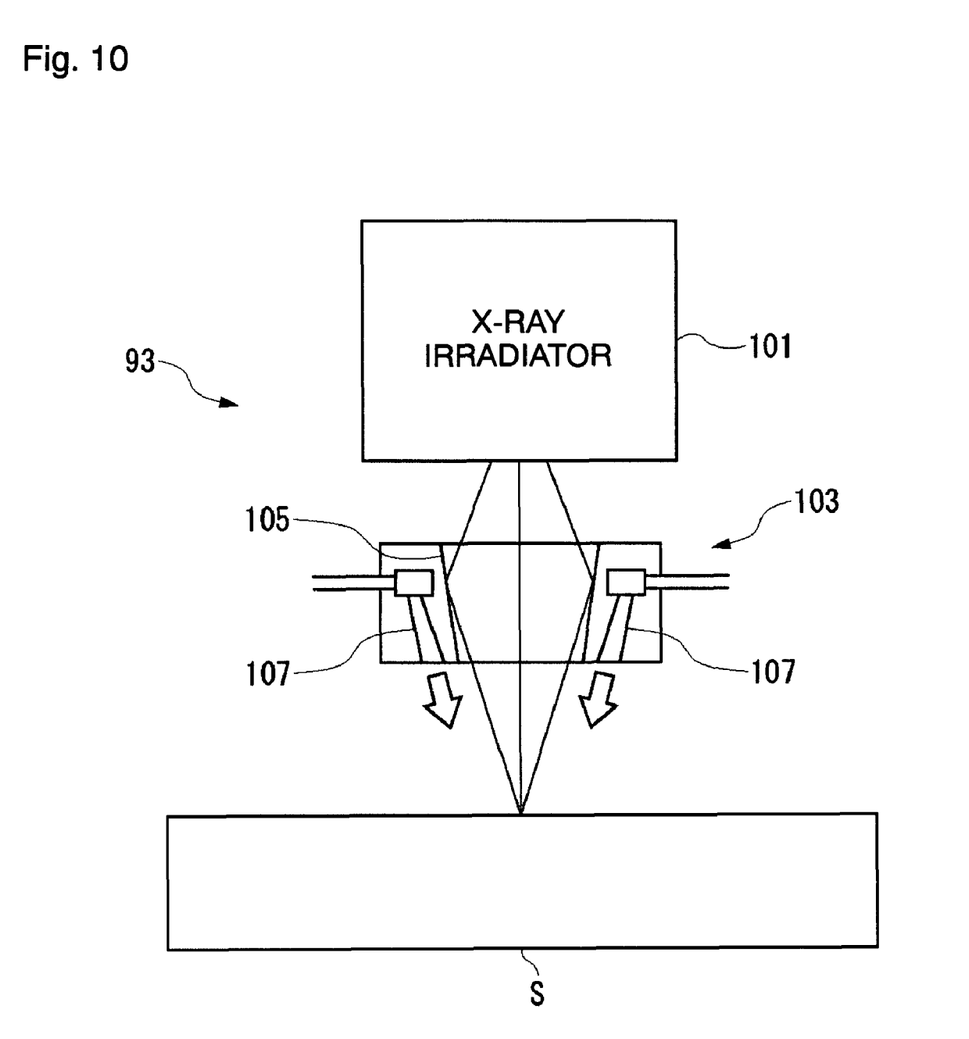
FIG. 10 shows another configuration example of a charge removal apparatus suitable for use in the vacuum chamber.

FIG. 10 shows a configuration of the charge removal apparatus 93 which is suitable for the above-described local charge removal. In FIG. 10, the charge removal apparatus 93 comprises an X-ray irradiator 101 and a guide 103. The guide 103 is arranged between the X-ray irradiator 101 and the sample S, and is configured to guide X-rays and the gas to the charge removal region. The guide 103 has an X-ray mirror 105 and a plurality of gas jet nozzles 107.

The X-ray mirror 105 is arranged in the center of the guide 103. X-rays are irradiated from the X-ray irradiator 101 to the guide 103. The guide 103. The X-ray mirror 105 guides the X-rays passing through the guide 103 to the charge removal region on the sample S. The X-ray mirror 105 is provided in such a way as to condense or collect X-rays on the sample S, and the spot size of the condensation is, for example, 1 mm in diameter.

The plurality of gas jet nozzles 107 are arranged around the X-ray mirror 105, and jet a gas supplied from gas introduction pipes to the sample S. In this example, the gas jet nozzles 107 are conical nozzles.

The direction of the jet from the plurality of gas jet nozzles 107 is adjusted such that the gas is jetted toward the irradiation region of X-rays. That is, the plurality of gas jet nozzles 107 are arranged such that the center axes of the nozzles are concentrated into a center point of the irradiation region of X-rays, and the jet region on the sample S is set within a small area of 1 to 3 mm in diameter.

As above, the guide 103 (the X-ray mirror 105 and the plurality of gas jet nozzles 107) is configured to guide X-rays and the gas to an identical position on the sample, that is, the guide 103 is configured such that the positions of the X-ray irradiation and gas jet correspond with each other. This common position is the charge removal region.

The charge removal apparatus 93 in FIG. 10 allows the charge removal region to be small, allowing for the local charge removal. This charge removal apparatus 93 performs the charge removal locally at the front section of the beam irradiation region for the inspections. An effective charge removal can thus be performed with a minimum amount of gas. An increase in pressure within the main chamber 11 can be minimized, the effects of the increase in pressure on the electron beam irradiation and inspections can be reduced, and the charge removal can be performed online.

Also in the configuration in FIG. 10, the open/close valve may be provided upstream of the gas jet nozzles 107, the open/close control may be performed, and the gas introduction may be performed in a pulsed manner. This can further minimize gas supply, and can reduce a decrease in the degree of vacuum (increase in pressure) to a minimum. The configuration in FIG. 10 is also provided in the chamber, so that an X-ray window or the like on the chamber wall is not required. X-rays are irradiated in the configuration in FIG. 10 but, alternatively, UV light may be irradiated. The charge removal apparatus 93 in FIG. 10 may be used for other purposes than the above-described online charge removal, and may be provided in the transport chamber 9 as illustrated in the second embodiment.

As described above, the charge removal apparatus 93 is provided in the main chamber 11 in the embodiment. The main chamber 11 is also a vacuum chamber as the transport chamber 9 is. Thus in the embodiment also, in the inspection apparatus for carrying out the plurality of types of inspections, the charge removal processes between the inspections can be done in a vacuum, the charge removal can be performed rapidly, and throughput can be improved.

Now, the above-described second embodiment (FIG. 7) and third embodiment (FIG. 9) will be compared with each other. In the third embodiment, the charge removal is performed within the main chamber 11. The sample S need not be transported to the transport chamber 9. Therefore, the charge removal can be completed more quickly, which is advantageous in rapidity.

On the other hand, in the second embodiment, the charge removal is performed within the transport chamber 9. The transport chamber 9 is evacuated to the same degree as the main chamber 11, but is separated from the main chamber 11 in view of the effect of dust from the transport robot 27 and the like. Since the gas introduction during the charge removal is performed in the transport chamber 9 in the second embodiment, any pressure change in the main chamber 11, in which the inspections are actually carried out, can be avoided. The second embodiment is particularly advantageous in this regard.

OTHER EMBODIMENTS

Other embodiments of the invention are, for example, as follows:
a mask inspection method or apparatus for inspecting a mask being the object to be inspected, using the above-described charged particle beam inspection method or apparatus;
a mask manufacturing method or apparatus in which an inspection is carried out in a mask manufacturing process by using the above-described charged particle beam inspection method or apparatus;
a mask inspected by the above-described mask inspection method or apparatus; a mask manufactured by the above-described mask manufacturing method or apparatus;
a semiconductor manufacturing method or apparatus for manufacturing a semiconductor device, using the above-described mask;
a semiconductor device manufactured by using the above-described mask; and a semiconductor device manufactured by the above-described semiconductor manufacturing method or apparatus.

The type of the mask includes, for example, a Cr mask, an EUV mask, or a nanoimprint mask. A Cr mask is used for optical exposure, an EUV mask is used for EUV exposure, and a nanoimprint mask is used for forming a resist pattern by means of nanoimprint lithography. Each of these masks having a pattern formed thereon may be a target of the inspections. A target of the inspections may be a mask (mask blank) in a state where a layer is formed but a pattern is not yet formed thereon.

The following is a description of a manufacturing method of a semiconductor device to which a mask inspected by the above-described charged particle beam inspection method and apparatus can be applied. This manufacturing method comprises the following processes (1) to (5):
(1) a wafer manufacturing process for manufacturing a wafer (or a wafer preparation process for preparing a wafer);
(2) a mask manufacturing process for manufacturing a mask to be used for exposure (or a mask preparation process for preparing a mask);
(3) a wafer processing process for applying required processing to the wafer;
(4) a chip assembly process for cutting out chips, one by one, formed on the wafer and allowing them to be operable; and
(5) a chip inspection process for inspecting the chip.

In the above-described wafer processing process (3), designed circuit patterns are sequentially laminated on a wafer, and many chips that operate as memories, MPUs, or the like are formed. This wafer processing process comprises the following plurality of processes:
(A) a thin film formation process for forming a dielectric thin film to be an insulating layer, a metal thin film to form wiring and electrodes, and the like (using CVD, sputtering, or the like);
(B) an oxidation process for oxidizing the thin-film layers and the wafer substrate;
(C) a lithography process for forming a resist pattern using the mask (reticle) in order to selectively process the thin-film layers, the wafer substrate, and the like;
(D) an etching process for processing the thin-film layers and the substrate according to the resist pattern (e.g. using a dry etching technique);
(E) an ion/impurity implantation and diffusion process;
(F) a resist stripping process; and
(G) a process for inspecting the processed wafer.

The wafer processing process is repeated as many times in total as required. The lithography process (C) is as follows:
(a) a resist coating process for coating the wafer, on which the circuit pattern is formed in the previous process, with a resist;
(b) a process for exposing the resist;
(c) a development process for developing the exposed resist to provide a resist pattern; and
(d) an annealing process for stabilizing the developed resist pattern.

There have been described various embodiments of the invention. The invention allows the plurality of types of inspections to be carried out by an identical inspection apparatus. In particular, the plurality of types of inspections are suitably carried out by using an inspection apparatus of a projection type. The capability of an identical apparatus to carry out the plurality of types of inspections can improve convenience for a user, can improve the inspection efficiency, and further can save space for the inspection apparatus.

Persons of ordinary skill in the art will realize that many modifications and variations of the above embodiments may be made without departing from the novel and advantageous features of the present invention. Accordingly, all such modifications and variations are intended to be included within the scope of the appended claims. The specification and examples are only exemplary. The following claims define the true scope and spirit of the invention.

What is claimed is:

1. An inspection method using a charged particle beam, the method comprising:
irradiating a charged particle beam onto an object to be inspected;
detecting a signal obtained from the object to be inspected; and
forming an image from the detected signal,
wherein an identical charged particle beam inspection apparatus carries out a plurality of types of inspections including a first, a second, and a third inspection which are a pattern defect inspection, a foreign material inspection, and an inspection for a defect in a multilayer, respectively, and in which charged particle beams having beam energies E1, E2, and E3 different from one another are irradiated, respectively;
wherein the relation between the beam energies E1, E2, and E3 is E1>E2 and E3>E2; and
wherein the first inspection, the second inspection and the third inspections are performed sequentially in time with the first inspection being performed first, then the second inspection and then the third inspection.

2. The inspection method according to claim 1, wherein charge is removed from the object to be inspected before at least one of the plurality of types of inspections.

3. The inspection method according to claim 2, wherein the charge removal is performed in a vacuum chamber.

4. A mask inspection method using the inspection method according to claim 1 to inspect a mask being the object to be inspected.

5. A semiconductor manufacturing method using the mask inspected by the mask inspection method according to claim 4 to manufacture a semiconductor device.

6. A charged particle beam inspection apparatus comprising:
   a stage for supporting an object to be inspected;
   a charged particle beam source for irradiating a charged particle beam onto the object to be inspected;
   a detector for detecting a signal obtained from the object to be inspected;
   an image processor for forming an image from the signal obtained from the detector; and
   an energy controller for controlling the beam energy of the charged particle beam to be irradiated onto the object to be inspected,
   wherein an identical charged particle beam inspection apparatus carries out a plurality of types of inspections including a first, a second, and a third inspection which are a pattern defect inspection, a foreign material inspection, and an inspection for a defect in a multilayer, and the energy controller controls beam energies in the pattern defect inspection, the foreign material inspection, and the inspection for a defect in a multilayer to be energies E1, E2, and E3 different from one another;
   wherein the relation between the beam energies E1, E2, and E3 is E1>E2 and E3>E2; and
   wherein the first inspection, the second inspection and the third inspections are performed sequentially in time with the first inspection being performed first, then the second inspection and then the third inspection.

7. The charged particle beam inspection apparatus according to claim 6, having a charge remover for removing charge from the object to be inspected before at least one of the plurality of types of inspections.

8. The charged particle beam inspection apparatus according to claim 7, wherein the charge remover is provided in a vacuum chamber.

9. A mask inspection apparatus using the charged particle beam inspection apparatus according to claim 6 to inspect a mask being the object to be inspected.

10. A semiconductor manufacturing apparatus using the mask inspected by the mask inspection apparatus according to claim 9 to manufacturing a semiconductor device.

11. The inspection method according to claim 1, wherein said pattern defect inspection includes comparing areas of an image of a sample with corresponding areas of an image of at least one other sample or with data and determining a defect based on a difference found.

12. The inspection method according to claim 1, wherein said particle inspection includes determining presence or absence of a particle from an image of a sample based on the amount of electrons detected.

13. The inspection method according to claim 1, wherein said multilayer defect inspection includes determining a defect based on a distribution of a surface potential of a sample.

14. The inspection method according to claim 1,
   wherein the first inspection, the second inspection and the third inspections are performed sequentially in time with the first inspection being performed first, then the second inspection and then the third inspection,
   wherein said pattern defect inspection includes comparing areas of an image of a sample with corresponding areas of an image of at least one other sample or with data and determining a defect based on a difference found,
   wherein said particle inspection includes determining presence or absence of a particle from an image of the sample based on the amount of electrons detected, and
   wherein said multilayer defect inspection includes determining a defect based on a distribution of a surface potential of the sample.

15. The inspection method according to claim 1, wherein magnification of said charged particle beam is changed depending on the type of inspection.

16. The inspection method according to claim 1, wherein dose amount of said charged particle beam is changed depending on the type of inspection.

17. The inspection method according to claim 2, wherein X-rays are irradiated and a gas is jetted on to a region from which charge is to be removed for removing charge.

18. The inspection method according to claim 1, further including employing a controller that controls the beam energy of the electron beam, magnification and dose amount depending on the types of inspections, such as to differ between each type of inspection.

19. The inspection method according to claim 1, wherein said inspection apparatus is an inspection apparatus of a projection type.

20. The inspection method according to claim 19, wherein said projection type inspection apparatus has a beam size according to a group of a plurality of pixels.

21. The inspection method according to claim 1, further including performing charge removal from the object to be inspected before at least one of the plurality of types of inspections using a vacuum system that includes a turbomolecular pump.

* * * * *